(12) United States Patent
Hosokawa et al.

(10) Patent No.: US 6,280,861 B1
(45) Date of Patent: Aug. 28, 2001

(54) ORGANIC EL DEVICE

(75) Inventors: Chishio Hosokawa, Chiba; Masahide Matsuura, Ichikawa; Hiroshi Tokailin, Sodegaura, all of (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 09/194,424

(22) PCT Filed: May 29, 1997

(86) PCT No.: PCT/JP97/01826

§ 371 Date: Jan. 21, 1999

§ 102(e) Date: Jan. 21, 1999

(87) PCT Pub. No.: WO97/46054

PCT Pub. Date: Dec. 4, 1997

(30) Foreign Application Priority Data

May 29, 1996 (JP) .................................................. 8-134541

(51) Int. Cl.[7] .................................................. H05B 33/14
(52) U.S. Cl. .................. 428/690; 428/156; 428/163; 428/209; 428/409; 428/690; 428/917; 313/503; 313/504; 313/505; 313/506; 313/510; 257/91; 257/96; 257/99
(58) Field of Search .................................. 428/156, 161, 428/163, 167, 409, 690, 917, 209; 313/503, 504, 505, 506, 510; 257/91, 96, 99

(56) References Cited

U.S. PATENT DOCUMENTS 4,539,507 * 9/1985 VanSlyke et al. .................... 313/504
5,294,870 * 3/1994 Tang et al. ............................ 313/504

FOREIGN PATENT DOCUMENTS

| | | |
|---|---|---|
| 58-102975 | 6/1983 | (JP) . |
| 61-176011 | 8/1986 | (JP) . |
| 63-213293 | 9/1988 | (JP) . |
| 2-253593 | 10/1990 | (JP) . |
| 4-87187 | 3/1992 | (JP) . |
| 4-254887 | 9/1992 | (JP) . |
| 6-5369 | 1/1994 | (JP) . |
| 7-235219 | 9/1995 | (JP) . |

* cited by examiner

Primary Examiner—Cynthia H. Kelly
Assistant Examiner—Ling Xu
(74) Attorney, Agent, or Firm—Oblon, Spivak, McClelland, Maier & Neustadt, P.C.

(57) ABSTRACT

An amorphous electrically conductive oxide such as In—Zn—O-containing amorphous oxide or amorphous ITO is used alone, or a laminate having a two- or three-layer structure constituted of the amorphous electrically conductive oxide and at least a thin metal layer is used, to form a transparent electrode whose side surface has a tapered form and whose top layer is formed of a layer of the above amorphous electrically conductive oxide, an organic single-layer portion or an organic multi-layer portion containing at least an organic light-emitting material is formed on the above transparent electrode, and further, an opposing electrode is formed on the above organic single-layer portion or the above organic multi-layer portion, whereby an organic EL device is obtained. A flattening layer is optionally provided so as to abut on the side surface of the transparent electrode for moderating a height-level difference between the above transparent electrode and the surface of the above substrate. Further, the above organic EL device is used to form an organic EL display panel.

26 Claims, 2 Drawing Sheets

ORGANIC EL DEVICE

TECHNICAL FIELD

The present invention relates to organic electroluminescence devices (electroluminescence will be abbreviated as "EL" hereinafter) and organic EL display panels using the organic EL device(s) as pixels.

TECHNICAL BACKGROUND

An EL device is a self-emitting device so that it has a high visibility. Further, it is a complete solid device and therefore has excellent shock resistance. Since an EL device has these features, there have been proposed a variety of inorganic EL devices using an inorganic compound as a light-emitting material and a variety of organic EL devices using an organic compound (this compound will be referred to as "organic light-emitting material" hereinafter) as a light-emitting material, and attempts are being made to use them practically.

Of the above devices, an organic EL device makes it possible to decrease an applied voltage to a great extent as compared with an inorganic EL device, and studies have been and are therefore actively made on the development and improvement of materials for accomplishing an organic EL device having higher performances. The organic EL device is being used as a surface light source, and since devices which emit various colors of light have been developed, it is also being applied to a display unit as a pixel. In a display unit using an organic EL device as a pixel, pixels formed of organic EL devices are two-dimensionally arranged on one plane to form a panel (organic EL display panel), and the organic EL devices (pixels) constituting the organic EL display panel are independently driven to allow the unit to display as desired.

An organic EL device is generally formed on a substrate, and in the basic constitution of an organic EL device of a type using the substrate side as a surface through which light comes out, an anode (transparent electrode) is formed on the substrate and a light-emitting layer and a cathode are consecutively formed. For improving the performance of the device, a hole-injecting layer is provided between the anode and the light-emitting layer and an electron-injecting layer is provided between the cathode and the light-emitting layer in some cases.

The material for the above transparent electrode (anode) is selected from transparent electrode materials having a surface resistance of about 15 $\Omega/\square$ or more such as crystalline ITO, ZnO:Al and the like. When the transparent electrode formed of the above material is used to produce, e.g., a X-Y matrix type organic EL display panel, the transparent electrode is required to have a relatively large thickness, as large as approximately 200 nm or more, and the electric resistance of the transparent electrode line is required to be approximately 10 K$\Omega$ or less, for preventing a decrease in display performances caused by a voltage drop, an increase in consumption power and an increase in RC time constant.

However, the use of the above thick transparent electrode (transparent electrode line) causes problems that (a) the device causes a short circuit due to a height-level difference of edge of the transparent electrode (height-level difference between upper surface of transparent electrode and surface of substrate), and that (b) an organic single-layer portion or an organic multi-layer portion, or an opposing electrode laminated on the organic single-layer portion or on the organic multi-layer portion, suffers the breakage of a line (the breakage of a line will be referred to as "height-level-difference-induced breakage" hereinafter) to cause a point defect or a line defect on an image.

Further, when the thickness of the transparent electrode is increased up to approximately 200 nm or more in the transparent electrode formed of the above transparent electrode material, the flatness of the transparent electrode surface is impaired. When an organic single-layer portion or an organic multi-layer portion and an opposing electrode are laminated on the above transparent electrode to obtain an organic EL device, there are caused problems that (c) a local concavo-convex shape increases so that a high voltage is locally caused during its driving, which results in a non-uniformity in brightness and consequently accelerated deterioration of the device, so that the stability in light emission is decreased, and that (d) the crystallization of an organic compound forming the organic single-layer portion or the organic multi-layer portion is accelerated, which results in a non-uniformity in brightness and a decrease in light emission capability.

As a method of preventing the height-level-difference-induced breakage caused on other layer when the other layer is formed on the transparent electrode, there is known a method, which is a method in an inorganic EL device, in which a plurality of stripe-shaped insulation films or glass protrusions are formed on a glass substrate and a transparent electrode having nearly the same height as that of the insulation films or the glass protrusions is formed between these insulation films or the glass protrusions (JP-A-61-176011).

On the other hand, as a method of preventing the crystallization of an organic compound forming the organic single-layer portion or the organic multi-layer portion in the organic EL device, there is known a method in which the surface of a transparent electrically conductive film which is formed first is polished until its flatness (10-point average roughness) becomes $\frac{1}{10}$ to $\frac{1}{100}$ of the thickness of a light-emitting layer (organic single-layer portion or organic multi-layer portion) and then patterned into a transparent electrode having a predetermined form (JP-A-4-87187). In this method, however, the fabrication of the transparent electrode, consequently, the production of an organic EL device, is complicated.

The occurrence of the above-described problems (a) to (d) can be prevented to some extent by employing a three-layer-structured thin transparent electrode disclosed in JP-A-2-253593, i.e., a thin transparent electrode in which the order of laminated layers viewed from the substrate side is a transparent electrically conductive layer (metal oxide layer), a thin metal layer and a transparent electrically conductive layer (metal oxide layer). A transparent electrode having a similar layer constitution is also described in European Laid-open Patent Publication No. 736913, column 10, lines 25 to 44.

Further, the occurrence of the above problems (a) to (d) can be also prevented to some extent by a transparent electrode (anode) described in JP-A-6-5369, i.e., an electrode of two-layer structure in which a first anode portion formed of a transparent electrically conductive layer and a second anode portion formed of a thin metal layer having a higher work function than the first anode portion are consecutively laminated when viewed from the substrate side and the first anode portion has a small thickness.

However, even if the above small-thickness transparent electrode having the above structure of a plurality of layers is used, the above-described problems (a) to (d), (a) and (b)

in particular, are liable to occur when it is required to form a number of organic EL devices like an organic EL display panel.

DISCLOSURE OF THE INVENTION

It is a first object of the present invention to provide organic EL devices which enables the easy production of an organic EL display panel having high display qualities while preventing a decrease in display performances caused by a voltage drop, an increase in consumption power and an increase in RC time constant.

Further, it is a second object of the present invention to provide organic EL display panels which can achieve high display qualities while preventing a decrease in display performances caused by a voltage drop, an increase in consumption power and an increase in RC time constant and which can be easily produced.

The organic EL device of the present invention for achieving the above first object is an organic EL device in which a transparent electrode is formed on a substrate, an organic single-layer portion or organic multi-layer portion containing at least an organic light-emitting material is formed on the transparent electrode and an opposing electrode is formed on the organic single layer portion or the organic multi-layer portion, the said transparent electrode has an amorphous electrically conductive oxide layer, has a surface resistance of 12 Ω/□ or less and a surface flatness of 20 nm or less and has a side surface having a tapered form, the said organic single-layer portion or organic multi-layer portion is formed on the said amorphous electrically conductive oxide layer (the above organic EL device will be referred to as "organic EL device I" hereinafter).

Other organic EL device of the present invention for achieving the above first object is an organic EL device in which a transparent electrode is formed on a substrate, an organic single-layer portion or organic multi-layer portion containing at least an organic light-emitting material is formed on the transparent electrode and an opposing electrode is formed on the organic single layer portion or the organic multi-layer portion, the said transparent electrode has an amorphous electrically conductive oxide layer and has a surface resistance of 12 Ω/□ or less and a surface flatness of 20 nm or less, the said organic single-layer portion or organic multi-layer portion is formed on the said amorphous electrically conductive oxide layer, a flattening layer is provided so as to abut on the side surface of the transparent electrode for moderating a height-level difference between the transparent electrode and the surface of the substrate (the above organic EL device will be referred to as "organic EL device II" hereinafter).

The organic EL display panels of the present invention for achieving the above second object comprises a plurality of pixels each of which is formed of the above organic EL device I or organic EL device II of the present invention, the pixels being two-dimensionally arranged on one plane.

PREFERRED EMBODIMENTS OF THE INVENTION

Figure 1A:
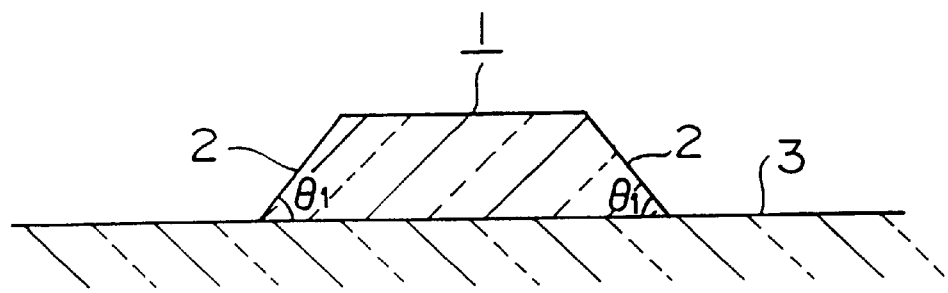
FIG. 1 is a cross-sectional view for explaining "an angle formed by a side surface of the transparent electrode and the substrate surface" referred to in the present invention.

Working embodiments of the present invention will be explained in detail hereinafter.

The organic EL device I of the present invention is explained first. As described above, the organic EL device I is an organic EL device in which a transparent electrode is formed on a substrate, an organic single-layer portion or organic multi-layer portion containing at least an organic light-emitting material is formed on the transparent electrode and an opposing electrode is formed on the organic single-layer portion or organic multi-layer portion. The above device constitution per se is the same as the constitution of a conventional organic EL device of a type using the substrate side as a surface through which light comes out.

In the organic EL device I of the present invention, the above transparent electrode is an electrode having an amorphous electrically conductive oxide layer and having a surface resistance of 12 Ω/□ or less and a surface flatness of 20 nm or less, and the side surface thereof has a tapered form. The above organic single-layer portion or organic multi-layer portion is formed on the above amorphous electrically conductive oxide layer.

The above amorphous electrically conductive oxide layer is preferably a layer formed of an amorphous oxide containing indium (In), zinc (Zn) and oxygen (O) as constituent elements and having an indium atomic ratio, $In/(In+Zn)$, of 0.5 to 0.9 (this amorphous electrically conductive oxide layer will be referred to as "In—Zn—O-containing amorphous electrically conductive oxide layer" hereinafter), a layer formed of an amorhhous ITO or a layer formed of an amorphous oxide which further contains a third metal such as Ga, Al, Sn or the like in addition to the above In—Zn—O-containing amorphous oxide (see JP-A-7-235219).

The above In—Zn—O-containing amorphous oxide layer can be easily formed by a sputtering method using a predetermined sputtering target, or the like. Further, the amorphous ITO layer can be formed by any one of various sputtering methods (DC sputtering, RF sputtering, DC magnetron sputtering, RF magnetron sputtering, ECR plasma sputtering, ion beam sputtering, etc.) or an ion plating method in the same manner as in the formation of a crystalline ITO film except that the substrate temperature is set at 200° C. or lower.

The transparent electrode constituting the organic EL device I of the present invention may be an electrode having a single-layer structure formed of the above amorphous electrically conductive oxide layer alone, or it may be an electrode having a two- or three-layer structure including a thin metal layer in addition to the above amorphous electrically conductive oxide layer. In any case, however, the surface resistance thereof is preferably adjusted to 12 Ω/□ or less. When an organic EL device having a transparent electrode having a surface resistance of over 12 Ω/□ is used to produce an organic EL display panel, there are incurred a decrease in display performances caused by a voltage drop, an increase in consumption power and an increase in RC time constant.

When a single-layer structure formed of the above amorphous electrically conductive oxide layer alone is employed as a layer structure of the transparent electrode, the surface resistance of the single-layer-structured transparent electrode (amorphous electrically conductive oxide layer) can be easily adjusted to 12 Ω/□ or less by properly adjusting the layer thickness depending upon the specific resistance thereof. Even if the surface resistance is 12 Ω/□ or less, however, the layer cannot give continuity and sometimes give a form of islands when the layer thickness is too small. It is therefore required to pay attention thereto. Further, when the layer thickness is too large, the light transmission capability thereof decreases. For these reasons, generally, the thickness of the transparent electrode formed of a single layer of the amorphous electrically conductive oxide is preferably 100 to 500 nm, more preferably 200 to 500 nm.

When the transparent electrode is layer-structured so as to have a two-layer structure of the amorphous electrically conductive oxide layer and a thin metal layer, the thickness of the above amorphous electrically conductive oxide layer is adjusted to 50 to 3,000 angstroms, preferably 500 to 1,000 angstroms, and it is preferred to use a metal having an electrical resistivity of $1 \times 10^{-5}$ Ωcm or less, such as Ag, Au, Al, Cu, Ni or Pt, to form a thin metal layer having a light transmittance of approximately 60 to 90% in the visible light region, for obtaining a transparent electrode having a surface resistance of 12 Ω/□ or less. When the thin metal layer has a thickness of approximately 10 to 100 angstroms, there can be obtained a thin metal layer having a light transmittance of approximately 70% or more in the visible light region. However, for obtaining a thin metal layer having a low electric resistance and a high light transmittance, more preferably, the thickness thereof is approximately 50 to 100 angstroms. The thin metal layer may have a single-layer structure, or it may have a structure of a plurality of layers.

When the transparent electrode is layer-structured so as to have a three-layer structure having at least a thin metal layer in addition to the amorphous electrically conductive oxide layer, preferably, the transparent electrode is formed of two transparent electrically conductive layers and one thin metal layer sandwiched between the above two transparent electrically conductive layers, and the above amorphous electrically conductive oxide layer is used as at least one of the above two transparent electrically conductive layers. The thickness of the amorphous electrically conductive oxide layer and the material and the thickness of the thin metal layer in this case are the same as those explained in the above transparent electrode of the two-layer structure. Further, when one of the two transparent electrically conductive layers is a transparent electrically conductive layer different from the above amorphous electrically conductive oxide layer, preferably, the above transparent electrically conductive layer is formed of crystalline ITO, ZnO:Al, SnO$_2$:Sb or the like, and the thickness thereof is adjusted to approximately 50 to 2,000 angstroms. The thickness thereof is more preferably 500 to 1,000 angstroms.

In any case when the transparent electrode is structured to have the above two-layer structure and when it is structured to have the above three-layer structure, the layer structure of the transparent electrode is selected such that the amorphous electrically conductive oxide layer is a top layer of the transparent electrode, for forming the organic single-layer portion or the organic multi-layer portion constituting the organic EL device on the amorphous electrically conductive oxide layer (constituting the transparent electrode).

The surface of the above amorphous electrically conductive oxide layer has a remarkably high flatness and is almost free of defects, and at a time when the amorphous electrically conductive oxide layer is formed on a substrate, it easily satisfies the condition of "surface flatness of 20 nm or less". When the transparent electrode is layer-structured to have the above two-layer or three-layer structure, the above amorphous electrically conductive oxide layer is formed on the thin metal layer, and even in this case, the amorphous electrically conductive oxide layer easily satisfies the condition of "surface flatness of 20 nm or less". Therefore, the transparent electrode in organic EL device I of the present invention is a transparent electrode which can be easily obtained as one having a surface flatness of 20 nm or less.

The "surface flatness" as used in the present invention means a root-mean-square value of surface roughness, and the "surface flatness" can be determined by means of a scanning tunneling microscope (STM), a scanning atomic force microscope (AFM) or a stylus thickness meter.

When a transparent electrode having a surface flatness of over 20 nm is used, a local concavo-convex shape increases in size, and as a result, it is difficult to obtain an organic EL device having a defect-free light-emitting surface and having excellent capability of uniform light emission. Further, the use of an transparent electrode having a surface flatness of 20 nm or less is also important for preventing a short circuit of the device.

In the organic EL device I of the present invention, the side surface of the above transparent electrode has a tapered form. In the present invention, "the transparent electrode having a side surface having a tapered form" means, with regard to the transparent electrode of the above single-layer structure, that the width of the upper surface thereof is smaller than the width of the lower surface thereof and that the side surface forms a plane-like inclined surface or an inwardly or outwardly curved surface. And, with regard to the transparent electrode of the above two- or three-layer structure, it means that the width of the upper surface thereof is smaller than the width of the lower surface thereof and that the side surface of at least the amorphous electrically conductive oxide layer constituting the transparent electrode is a plane-like inclined surface or an inwardly or outwardly curved surface. The use of the transparent electrode having a tapered side surface can prevent the occurrence of the height-level-difference-induced breakage in the organic single-layer portion or the organic multi-layer portion laminated on the transparent electrode or the opposing electrode formed on the organic single-layer portion or the organic multi-layer portion.

Figure 1B:
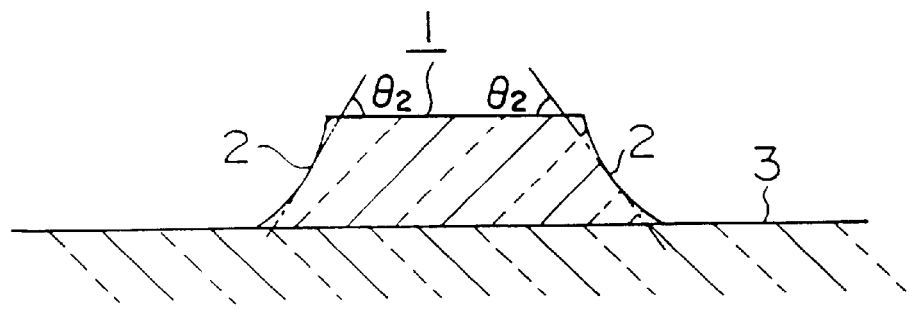
Figure 1C:
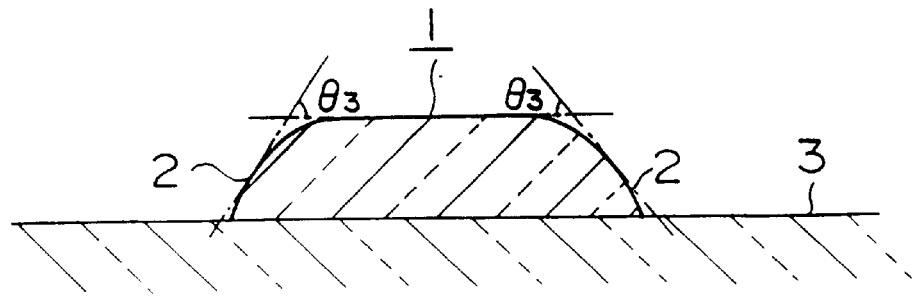

When the transparent electrode whose side surface has a tapered form and is also inclined in the form of a plane is used, an angle $\theta_1$ formed by the side surface 2 of the transparent electrode 1 and the substrate surface 3 is preferably 60° or less, particularly preferably 40° or less, as shown in FIG. 1(*a*), for preventing the above height-level-difference-induced breakage.

Further, when the transparent electrode whose side surface has a tapered form and is also inwardly curved is used, an angle $\theta_2$ formed by the tangent line (shown by an alternate long and short dash line in Figure) which is included in tangent lines on the side surface 2 of the transparent electrode 1 and is passing a point located as high as ½ of the height of thickness of the transparent electrode 1 and the upper surface of the transparent electrode 1 is preferably 60° or less, particularly preferably 40° or less, as shown in FIG. 1(*b*), for preventing the above height-level-difference-induced breakage.

Further, when the transparent electrode whose side surface has a tapered form and is also outwardly curved is used, an angle $\theta_3$ formed by the tangent line (shown by an alternate long and short dash line in Figure) which is included in tangent lines on the side surface 2 of the transparent electrode 1 and is passing a point located as high as ½ of the height of thickness of the transparent electrode 1 and the upper surface of the transparent electrode 1 is preferably 60° or less, particularly preferably 40° or less, as shown in FIG. 1(*c*), for preventing the above height-level-difference-induced breakage.

In the present invention, it should be understood that the above $\theta_2$ and $\theta_3$ are also included in the "angle formed by the side surface of the transparent electrode and the surface of the substrate".

The transparent electrode having a side surface having a tapered form can be obtained by first forming an transparent electrically conductive layer of material for the transparent electrode on a substrate first and wet-etching or dry-etching the transparent electrically conductive layer according to a predetermined method.

When the transparent electrically conductive layer is wet-etched to form the transparent electrode having a side surface having a tapered form, the etching is carried out, e.g., by one of the following procedures (A) to (D) depending upon layers to be wet-etched.

(A) A case of wet-etching a single-layer-structured transparent electrically conductive layer formed of In—Zn—O-containing amorphous oxide (including an oxide containing a third metal such as Ga, Al or Sn. The same hereinafter.)

A photoresist film is formed on a transparent electrically conductive layer, and exposure using a predetermined exposure master mask and development using a predetermined developer solution are carried out, to form a resist pattern on the transparent electrically conductive layer where the transparent electrode is to be formed. Then, wet-etching is carried out with a 10 to 15% HBr aqueous solution, an $HCl:HNO_3:H_2O=2:1:1$ (weight ratio) aqueous solution of hydrochloric acid, nitric acid and water, or the like as an etchant. Then, the above resist pattern is removed with a predetermined release solution, to obtain a transparent electrode having a side surface having a tapered form.

When a 10 to 15% HBr aqueous solution is used as an etchant, there can be obtained a transparent electrode having a side surface forming an angle of about 30° with the surface of a substrate. When an $HCl:HNO_3:H_2O=2:1:1$ (weight ratio) aqueous solution of hydrochloric acid, nitric acid and water is used, there can be obtained a transparent electrode having a side surface forming an angle of about 40° with the surface of a substrate.

In the above wet-etching, no residue remains, and remarkably excellent etching can be carried out. If there should be a residue caused by the wet-etching, it is required to remove the residue since it forms protrusions.

(B) A case of wet-etching a two or three-layer-structured transparent electrically conductive layer having at least a thin metal layer in addition to the In—Zn—O-containing amorphous electrically conductive oxide layer of the above (A)

The wet-etching can be carried out in the same manner as in the above (A). When the thin metal layer is hard to etch, e.g., when it is formed of Pt, Au, or the like, a desired wet-etching can be carried out by incorporating a component capable of dissolving the hard-to-etch thin metal layer into the above etchant.

(C) A case of wet-etching a single-layer-structured transparent electrically conductive layer formed of the amorphous ITO layer The wet-etching can be carried out in the same manner as in the above (A) except that the etchant is replaced with a 15 to 30% HBr aqueous solution or an $HCl:HNO_3:H_2O=2:1:1$ to 3:2:1 (weight ratio) aqueous solution of hydrochloric acid, nitric acid and water.

When a 15 to 30% HBr aqueous solution is used as an etchant, there can be obtained a transparent electrode having a side surface forming an angle of 30 to 50° with the surface of a substrate. When an $HCl:HNO_3:H_2O=2:1:1$ to 3:2:1 (weight ratio) aqueous solution of hydrochloric acid, nitric acid and water is used, there can be obtained a transparent electrode having a side surface forming an angle of 20 to 60° with the surface of a substrate.

(D) A case of wet-etching a two- or three-layer-structured transparent electrically conductive layer having a thin metal layer in addition to the amorphous ITO layer.

The wet-etching can be carried out in the same manner as in the above (C). When the thin metal layer is hard to etch, e.g., when it is formed of Pt, Au, or the like, a desired wet-etching can be carried out by incorporating a component capable of dissolving the hard-to-etch thin metal layer into the above etchant.

On the other hand, when the transparent electrically conductive layer is dry-etched to form an transparent electrode having a tapered side surface, a resist pattern is formed on the transparent electrically conductive layer in the same manner as in the case of wet-etching, and then, the resist pattern is thermally cured, etc., to taper a height-difference portion (side surface). Then, when the above transparent electrically conductive layer has a single-layer structure formed of the amorphous electrically conductive oxide layer, $CH_4/HCl$ mixed gases or HI/Ar mixed gases are used as an etching gas, and the etching is carried out with plasma or ion of the above etching gas. When the transparent electrically conductive layer has a two- or three-layer-structure having a thin metal layer in addition to the amorphous electrically conductive oxide layer, a fluorinated hydrocarbon gas such as $CF_4$ gas, or the like, is added to the above etching gas (mixed gases) as required depending upon the layer thickness, and the resultant mixture is used as an etching gas to carry out the etching.

Thereafter, the above resist pattern is removed with a predetermined release solution, whereby a transparent electrode having a tapered side surface can be obtained.

When $CH_4/HCl$ mixed gases are used as an etching gas, there can be obtained a transparent electrode having a side surface forming an angle of approximately 30 to 60° with the surface of a substrate. When HI/Ar mixed gases are used, there can be obtained a transparent electrode having a side surface forming an angle of about 50° with the surface of a substrate.

In the organic EL device I having the above-explained transparent electrode, the surface resistance of the transparent electrode is as small as 12 Ω/☐ or less. When the above organic EL device I is used, therefore, there can be obtained an organic EL display panel in which a decrease in display performances caused by a voltage drop, an increase in consumption power and an increase in RC time constant are prevented.

Further, since the surface flatness of the above transparent electrode is already 20 nm or less at a time when the transparent electrically conductive layer as a material for the transparent electrode is formed, it is not necessary to carry out treatments such as polishing treatment for obtaining a transparent electrode having a desired surface flatness, and the production thereof is therefore easy. Further, the organic EL device I having the above transparent electrode, provided by the present invention, has almost no local concavo-convex shapes and is also almost free from the acceleration of crystallization of an organic compound forming the organic single-layer portion or the organic multi-layer portion. There are therefore rarely caused non-uniformity in brightness, a decrease in light emission stability and a decrease in light emission capability.

Further, in the organic EL device I of the present invention in which the side surface of the above transparent electrode is tapered as described above, a height-level difference between the side surface of the transparent electrode and the substrate surface gradually decreases from the upper surface of the transparent electrode to the lower surface thereof, and the organic single-layer portion or the organic multi-layer portion formed on the transparent electrode therefore hardly causes the height-level-difference-induced breakage. Similarly, the opposing electrode formed on the above organic single-layer portion or multi-layer portion hardly causes the height-level-difference-induced breakage.

As a result, when the organic EL device I of the present invention is used to produce an organic EL display panel, there can be easily produced an organic EL display panel having high display qualities.

The organic EL device I having the above properties, provided by the present invention, is not only suitable as a pixel for an organic EL display panel but also suitable as a surface light source.

The substrate, the organic single-layer portion or the organic multi-layer portion and the opposing electrode for constituting the organic EL device I of the present invention will be explained later.

The organic EL device II of the present invention will be explained hereinafter.

The organic EL device II of the present invention is an organic EL device in which a transparent electrode is formed on a substrate, an organic single-layer portion or organic multi-layer portion containing at least an organic light-emitting material is formed on the transparent electrode and an opposing electrode is formed on the organic single-layer portion or the organic multi-layer portion. Like the above-explained organic EL device I of the present invention, the above device constitution per se is the same as the constitution of a conventional organic EL device of a type using the substrate side as a surface through which light comes out.

The greatest features of the organic EL device II of the present invention are that the above transparent electrode is an electrode having an amorphous electrically conductive oxide layer and having a surface resistance of 12 Ω/□ or less and a surface flatness of 20 nm or less, that the above organic single-layer portion or organic multi-layer portion is formed on the above amorphous electrically conductive oxide layer, and that the a flattening layer for moderating a height-level difference between the transparent electrode and the surface of the substrate is provided.

The above transparent electrode preferably has a layer constitution as shown and explained in the explanation of the organic EL device I of the present invention. Further, the side surface of the transparent electrode may be a side surface which is not tapered such as a perpendicular surface, an inwardly curved surface, etc., or it may be a side surface which is tapered like the counterpart of the organic EL device I of the present invention.

The reasons why the above transparent electrode is required to have a surface resistance of 12 Ω/□ and a surface flatness of 20 nm or less is the same as those explained with regard to the above organic EL device I of the present invention. Further, the preferred range of the surface resistance and the preferred range of the surface flatness are also the same as those explained with regard to the above organic EL device I of the present invention.

In the organic EL device II of the present invention, like the above organic EL device I of the present invention, the organic single-layer portion or the organic multi-layer portion constituting the organic EL device II is formed on the above amorphous electrically conductive oxide layer. And, a flattening layer for moderating a height-level difference between the transparent electrode and the surface of the substrate is provided so as to abut on the side surface of the transparent electrode having the above amorphous electrically conductive oxide layer.

Figure 2A:
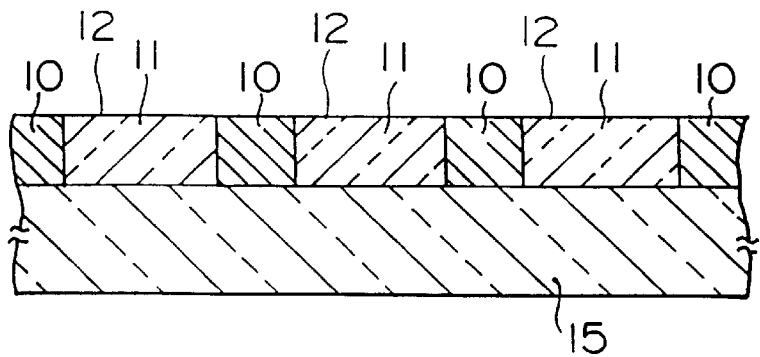
FIG. 2 is a cross-sectional view for explaining "a flattening layer" referred to in the present invention.
Figure 2B:
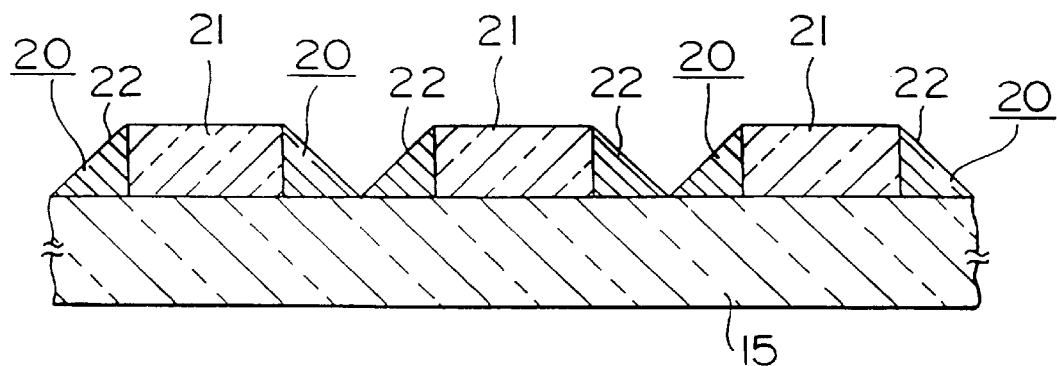

As shown in FIG. 2(a), the above flattening layer 10 preferably forms a flat surface 12 together with a transparent electrode 11. However, the flattening layer and the transparent electrode are not necessarily required to form a flat surface, and the flattening layer may be a flat layer having a thickness sufficient for adjusting a height-level difference between the upper surface of the transparent electrode and the substrate surface to approximately 150 nm or less. Further, as shown in FIG. 2(b), the flattening layer 20 may abut on the side surface of a transparent electrode 21 and may form a tapered face 22. And, as shown in FIG. 2(c), a tapered face 31 formed by the flattening layer 30 is not necessarily required to reach the substrate surface.

Figure 2C:
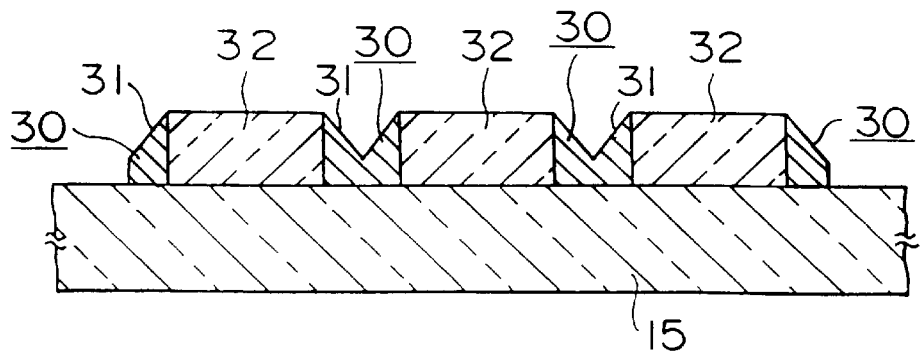

In all the FIGS. 2(a), 2(b) and 2(c), numeral 15 indicates the substrate. Further, the above "tapered face 22" formed by the flattening layer may be any one of a plane-like inclined surface, an inwardly curved surface or an outwardly curved surface. When the tapered face 22 reaches the substrate surface, it is to have the same form as the form of the side surface of the transparent electrode constituting the above organic EL device I of the present invention.

The above flattening layer is formed of an electrically insulating substance including oxides such as silicon oxide, fluorine-added silicon oxide, aluminum oxide, tantalum oxide, chromium oxide, titanium oxide and ytterbium oxide, nitrides such as silicon nitride and polymers such as polyimide, polyolefin, polyacrylate, polyquinoline, a fluorine-containing polymer and polycarbonate. The material for the flattening layer is particularly preferably selected from the electrically insulating oxides. The flattening layer can be formed, e.g., by any one of the following procedures (i) to (iii).

(i) A transparent electrically conductive layer as a material for the transparent electrode is formed on a substrate, a photoresist film is formed on the transparent electrically conductive layer, and exposure using a predetermined exposure master mask and development using a predetermined developer solution are carried out, to form a resist pattern on the transparent electrically conductive layer where the transparent electrode is to be formed. Then, those portions of the transparent electrically conductive layer which have no resist pattern formed are etched with a predetermined etchant or an etching gas, to prepare a transparent electrode (in a state where a resist pattern is formed thereon).

Then, before the resist pattern is removed, a layer having a predetermined thickness is formed from a predetermined flattening layer material, on the substrate surface on the side where the above resist pattern is formed (on the side where the transparent electrically conductive layer has been etched). The above layer is formed by a vacuum deposition method, a sputtering method, a CVD method, a spin coating method, a bar coating method or an application method, etc, depending upon the flattening layer material. The above layer is formed on the substrate surface (place where no transparent electrode is formed) and on the resist pattern, and the above layer formed on the substrate surface is to form the flattening layer.

Then, the above resist pattern is removed with a predetermined release solution, to give the intended flattening layer.

When the flattening layer having a tapered face is formed, a transparent electrode having a predetermined form is formed, then, an electrically insulating polymer layer having a predetermined width is formed only on a side surface of the transparent electrode, and the electrically insulating polymer layer is thermally cured, whereby the intended flattening layer can be formed. As the electrically insulating polymer layer is thermally cured, the electrically insulating polymer layer shrinks, and as a result, there is obtained a flattening layer having a tapered face.

(ii) A layer having a predetermined thickness is formed on a substrate surface from a predetermined flattening layer material, a photoresist film is formed on the above layer, and then exposure using a predetermined exposure master mask and development using a predetermined developer solution are carried out, to form a resist pattern on the layer where the flattening layer is to be formed. Then, those portions of the above layer which have no resist pattern formed are etched with a predetermined etchant or an etching gas, to prepare a flattening layer (in a state where a resist pattern is formed thereon).

Then, before the resist pattern is removed, a transparent electrically conductive layer having a predetermined thickness is formed from a desired electrically conductive material on the substrate surface on the side where the above resist pattern is formed (on the side where the above layer has been etched). In this case, the transparent electrically conductive layer is formed on the substrate surface (places where no flattening layer is formed) and on the resist pattern, and the above transparent electrically conductive layer formed on the substrate surface is to form a transparent electrode.

Then, the above resist pattern is removed with a predetermined release solution, to obtain an intended flattening layer.

(iii) A transparent electrode (in a state where a resist pattern is formed thereon) is obtained in the same manner as in the above (i), and before the resist pattern on the transparent electrode is removed, an electrically conductive metal layer having a predetermined thickness is formed from a desired electrically conductive metal such as Al, Ta, Cr, Ti or the like on the substrate surface on the side where the above resist pattern is formed (on the side where the transparent electrically conductive layer has been etched). The above electrically conductive metal layer is formed on the substrate surface (places where the transparent electrode is not formed) and on the resist pattern by a method such as a vacuum deposition method, a sputtering method, or the like.

Then, the above electrically conductive metal layer is anodized in a neutral electrolytic solution prepared by using ammonium tartarate, citric acid, citric acid salt, phoshphoric acid or phosphoric acid salt, etc. In the anodization, preferably, the above electrically conductive metal layer is used as an anode and a platinum electrode is used as a cathode. The voltage to be applied to the anode is preferably set at 30 to 700 V depending upon the thickness of the electrically conductive metal layer, and in this case, the above electrically conductive metal layer is anodized 5 to 30 angstroms thick per V. When the above electrically conductive metal layer is anodized in the neutral electrolytic solution, an oxide layer which is not porous but dense can be formed.

Thereafter, the above resist pattern is removed with a predetermined release solution, to obtain the intended flattening layer.

In the organic EL device II having the above transparent electrode and the above flattening layer, provided by the present invention, the surface resistance of the transparent electrode is as small as 12 Ω/□ or less. When the above organic EL device II is used, therefore, like the above organic EL device I of the present invention, there can be obtained an organic EL display panel in which a decrease in display performances caused by a voltage drop, an increase in consumption power and an increase in RC time constant are prevented.

Further, since the surface flatness of the above transparent electrode is already 20 nm or less at a time when the transparent electrically conductive layer as a material for the transparent electrode is formed, it is not necessary to carry out treatments such as polishing treatment for obtaining a transparent electrode having a desired surface flatness, and the production thereof is therefore easy. Further, like the above organic EL device I of the present invention, the organic EL device II having the above transparent electrode, provided by the present invention, has almost no local concavo-convex shapes and is also almost free from the acceleration of crystallization of an organic compound forming the organic single-layer portion or the organic multi-layer portion. There are therefore rarely caused non-uniformity in brightness, a decrease in light emission stability and a decrease in light emission capability.

Further, in the organic EL device II of the present invention in which a height-level difference between the upper surface of the transparent electrode and the substrate surface is moderated by the flattening layer, the organic single-layer portion or the organic multi-layer portion formed on the transparent electrode therefore hardly causes the height-level-difference-induced breakage like the above organic EL device I of the present invention, and similarly, the opposing electrode formed on the above organic single-layer portion or multi-layer portion hardly causes the height-level-difference-induced breakage.

As a result, when the organic EL device II of the present invention is used to produce an organic EL display panel, there can be easily produced an organic EL display panel having high display qualities.

The organic EL device II having the above properties, provided by the present invention, is not only suitable as a pixel for an organic EL display panel but also suitable as a surface light source.

The organic EL device I and the organic EL device II of the present invention may be those having the transparent electrode that can be formed as described above, and the constitution of other layers is not specially limited so long as they function as an organic EL device.

The layer constitution of an organic EL device includes various constitutions, and specific examples of the layer constitution of organic EL device of a type in which the organic EL device is formed on a transparent substrate and the transparent substrate is used as a surface through which light comes out include those whose layer laminating orders are the following (1) to (4).

(1) Anode (transparent electrode)/light-emitting layer/cathode (opposing electrode)
(2) Anode (transparent electrode)/hole-injecting layer/light-emitting layer/cathode (opposing electrode)
(3) Anode (transparent electrode)/light-emitting layer/electron-injecting layer/cathode (opposing electrode)
(4) Anode (transparent electrode)/hole-injecting layer/light-emitting layer/electron-injecting layer/cathode (opposing electrode)

In the organic EL device of the above (1) type, the light-emitting layer corresponds to the organic single-layer portion referred to in the present invention. In the organic EL device of the above (2) type, the hole-injecting layer and the light-emitting layer correspond to the organic multi-layer portion referred to in the present invention. In the organic EL device of the above (3) type, the light-emitting layer and the electron-injecting layer correspond to the organic multi-layer portion referred to in the present invention. In the organic EL device of the above (4) type, the hole-injecting layer, the light-emitting layer and the electron-injecting layer correspond to the organic multi-layer portion referred to in the present invention.

The light-emitting layer is generally formed of one or a plurality kinds of organic light-emitting materials, while it is sometimes formed of a mixture of a light-emitting material with an electron-injecting material and/or a hole-injecting material, or a polymer material in which the above mixture or an organic light-emitting material is dispersed. Further, on the circumference of the above layer-structured organic EL device, a sealing layer for the prevention of infiltration of water and oxygen into the organic EL device is sometimes formed so as to cover the organic EL device.

In the organic EL device of the present invention, there are no limitations to be imposed on materials other than the materials for the transparent electrode (anode), and various materials can be used. Each of the layers other than the transparent electrode will be explained below including the substrate as well.

(A) Substrate

When the substrate is used as a surface through which light comes out, a transparent substrate is used as already described. The transparent substrate is sufficient for use if it is formed of a substance having a high transmittance (generally, at least 80%) to light (EL light) emitted from the light-emitting layer. Specific examples thereof include plate-like materials, sheet-like materials or film-like materials of transparent glass such as alkali glass and alkali-free glass, transparent resins (thermoplastic resins or thermosetting resins) such as polyethylene terephthalate, polycarbonate, polyether sulfone, polyether ether ketone, polyvinyl fluoride, polyacrylate, polypropylene, polyethylene, amorphous polyolefin and a fluorine-containing resin, or quartz.

When the substrate of a transparent resin is used, a vapor-barrier inorganic oxide layer (e.g., a 5 to 200 nm thick layer formed of silicon oxide, aluminum oxide, titanium oxide, zirconium oxide, yttrium oxide, ytterbium oxide, magnesium oxide, tantalum oxide, cerium oxide or hafnium oxide) may be formed on the surface thereof as required for preventing the infiltration of oxygen and water into the organic EL device.

The above vapor-barrier inorganic oxide layer is formed on the substrate formed of a transparent resin, and besides, it may be formed on a substrate formed of a substance different from the transparent resin. When the above vapor-barrier inorganic oxide layer is formed on the substrate formed of a substance different from the transparent resin, the vapor-barrier inorganic oxide layer can be utilized as an undercoat layer for the transparent electrode.

It can be properly determined depending upon the use of the intended organic EL device what transparent substrate is to be used.

When the substrate is not used as a surface through which light comes out (e.g., when an organic EL device which emits light through its side face is produced), substrates other than the above transparent substrate may be used as a substrate.

(B) Light-emitting layer

The organic light-emitting material for use as material for the light-emitting layer is sufficient for use if it has all of three functions in combination, (a) the function of injecting charges, i.e., the function in which holes can be injected from the anode or the hole-injecting layer, and electrons can be injected from the cathode or the electron-injecting layer, when an electric field is applied, (b) the function of transportation, i.e., the function in which the injected holes and electrons can be moved under the force of an electric field, and (c) the function of emitting light, i.e., the function of providing a field where electrons and holes are recombined to emit light. However, the above material is not required to have sufficient performances of all of the above functions (a) to (c) in combination. For example, some of materials having the hole injection and transportation performances excellent over the electron injection and transportation performances are suitable as an organic light-emitting material.

Examples of the organic light-emitting material include fluorescent brighteners such as benzothiazole-containing, benzoimidazole-containing and benzooxazole-containing fluorescent brighteners, a styrylbenzene-containing compound, 12-phthaloperinone, 1,4-diphenyl-1,3-butadiene, 1,1,4,4-tetraphenyl-1,3-butadiene, a naphthalimdie derivative, a perylene derivative, an oxadiazole derivative, an aldazine derivative, a pyraziline derivative, a cyclopentadiene derivative, a pyrrolopyrrole derivative, a styrylamine derivative, a coumarine-containing compounds, polymer compounds described in Published International Patent Application No. WO90/13148 and Appl. Phys. Lett., vol. 58, 18, p.1982 (1991), an aromatic dimethylidene-containing compound, and a compound of the following general formula (I),

$$(R-Q)_2-Al-O-L \qquad (I)$$

(wherein L is a hydrocarbon containing a phenyl portion and having 6 to 24 carbon atoms, O—L is a phenolato ligand, Q is a substituted 8-quinolinolato ligand, and R is a 8-quinolinolato ring substituent selected so as to sterically hinder the bonding of more than 2 substituted 8-quinolinolato ligands to an aluminum atom).

In addition, a compound obtained by doping the above organic light-emitting material as a host with a fluorescent dyestuff having an intensity in blue to green, e.g., a coumarine-containing fluorescent dyestuff or a fluorescent dyestuff similar to the above host is also suitable as an organic light-emitting material. Specific examples of the host as a material for the above compound include organic light-emitting materials having a distyrylarylene skeleton (particularly preferably, e.g., 4,4'-bis(2,2-diphenylvinyl) biphenyl). Specific examples of the dopant as a material for the above compound include diphenylaminovinylarylene (particularly preferably, e.g., N,N-diphenylaminobiphenylbenzene) and 4,4'-bis[2-[4-(N,N-di-p-tolyl)phenyl]vinyl]biphenyl).

The light-emitting layer can be formed from the above organic light-emitting material by a known method such as a vapor deposition method, a spin coating method, a casting method or an LB method, while it is preferred to use a method other than a sputtering method. Further, the light-emitting layer can be also formed by dissolving a binder such as a resin and a light-emitting material in a solvent to form a solution and spin-coating the solution to form a thin layer.

The thickness of the light-emitting layer formed as described above is not specially limited and can be selected properly depending upon situations, while it is preferably in the range of from 5 nm to 5 μm.

(C) Hole-injecting layer

The material (to be referred to as "hole-injecting material" hereinafter) for the optionally formed hole-injecting layer is sufficient for use so long as it has the capability of injecting holes or barrier properties against electrons. For example, it can be properly selected from hole-injecting materials conventionally used for an electrophotographic photoreceptor, and it preferably has a hole mobility of at least $10^{-5}$ cm$^2$/Vs (electric field intensity $10^4$ to $10^5$ V/cm). The hole-injecting material may be any one of an organic material and an inorganic material.

Specific examples thereof a triazole derivative, an oxadiazole derivative, an imidazole derivative, a polyaryl alkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, polysilane, an aniline-based copolymer, an electrically conductive high-molecular-weight oligomer (thiophene oligomer in particular), a porphyrin compound, an aromatic tertiary amine compound, a styrylamine compound, the above aromatic dimethylidene-containing compound described as an organic light-emitting material, and inorganic semiconductors such as a p-type Si and p-type SiC.

As a hole-injecting material, it is preferred to use a porphyrin compound, an aromatic tertiary amine compound or a styrylamine compound, and it is particularly preferred to use an aromatic tertiary amine compound.

The hole-injecting layer may have a single-layer structure formed of one or more of the above materials, or it may have a structure of a plurality of layers formed of one composition or different compositions. When the hole-injecting layer having a structure of a plurality of layers is formed, the layer which is to be in contact with the light-emitting layer is preferably a layer formed of a compound which has the capability of transporting holes and does not cause any light non-emission defect even when brought into contact with the light-emitting layer (the above layer will be referred to as "hole-transporting layer" hereinafter). The "light non-mission defect" refers to a defect in which an excited state may be extinguished by the interaction of the light-emitting layer and the hole-transporting layer, and it includes, for example, an exciplex and CT (charge-transfer complex). As a material for the hole-transporting layer, a compound which does not generate any light non-emission defect when brought into contact with the organic light-emitting material is selected from the above hole-injecting materials.

The hole-injecting layer (including the hole-transporting layer) can be formed by forming a thin layer of the above hole-injecting material (including a material for the hole-transporting layer) according to a known method such as a vacuum deposition method, a spin coating method, a casting method or an LB method. Although not specially limited, the thickness of the hole-injecting layer as a whole is generally 5 nm to 5 μm.

(D) Electron-injecting layer

The material (to be referred to as "electron-injecting material" hereinafter) for the optional electron-injecting layer is sufficient for use so long as it has the function of transmitting electrons injected from a cathode to the light-emitting layer. Generally, preferred is a material whose affinity for electrons is greater than the affinity of the organic light-emitting material for electrons and is smaller than the work function of the cathode (a minimum work function when the cathode is formed of a multi-component material). However, where an energy level difference is extremely large, undesirably, barriers against electron injection are present therein. The affinity of the electron-injecting material for electrons preferably equivalent to the work function of the cathode or the affinity of the organic light-emitting material for electrons in magnitude. The electron-injecting material may be any one of an organic material and an inorganic material.

Specific examples of the electron-injecting material include a nitro-substituted fluorenone derivative, an anthraquinodimethane derivative, a diphenylquinone derivative, a thiopyrane dioxide derivative, heterocyclic tetracarboxylic acid anhydrides such as a naphthaleneperylene, carbodiimide, a fluorenylidenemethane derivative, an anthrone derivative, an oxadiazole derivative, a series of electron-transmitting compounds disclosed as a material for a light-emitting layer in JP-A-59-194393, a thiazole derivative formed by substituting a sulfur atom for an oxygen atom of an oxadiazole ring, a quinoxaline derivative having a quinoxaline ring known as an electron-attracting group, a metal complex of 8-quinolinol derivative, metal-free or metal phthalocyanine, metal-free or metal phthalocyanine having its terminal replaced with an alkyl group, a sulfone group, etc., the above distyrylpyrazine derivate described as an organic light-emitting material, and inorganic semiconductors such as n-type Si and n-type SiC.

The electron-injecting layer may have a single-layer structure formed of one or more of the above materials, or it may have a structure of a plurality of layers formed of one composition or different compositions. The electron-injecting layer can be formed by forming a thin layer of the above electron-injecting material according to a known method such as a vacuum deposition method, a spin coating method, a casting method or an LB method. Although not specially limited, the thickness of the electron-injecting layer is generally 5 nm to 5 μm.

(E) Cathode (opposing electrode)

The material for the cathode (opposing electrode) is preferably selected from a metal having a small work function (e.g., 4 eV or less), an alloy, an electrically conductive compound or mixtures of these. Specific examples thereof include sodium, a sodium-potassium alloy, magnesium, lithium, an alloy or mixed metals of magnesium and silver, a magnesium-copper mixture, aluminum, Al/Al$_2$O$_3$, an Al-Li alloy, indium and rare earth metals such as ytterbium.

The thickness of the cathode (opposing electrode) can be generally selected in the range of from 10 nm to 1 μm as required depending upon a cathode material, and the surface resistance thereof is preferably several hundreds Ω/□ or less. The magnitude of the work function used as a base for selecting a cathode (opposing electrode) material is not to be limited to 4 eV.

In the organic EL device I and the organic EL device II of the present invention, various substances can be used for the layers including the substrate other than the transparent electrode, and various layer structures can be also employed for the layer structure, as described above. Further, the transparent electrode, the organic single-layer portion or organic multi-layer portion and the opposing electrode can be formed by various methods as described above. When a vacuum deposition method is used for the formation of each layer, the organic EL device can be formed according to the vacuum deposition method alone, which is advantageous for simplifying a machine and equipment and decreasing the period of production time thereof.

The organic EL device I and the organic EL device II of the present invention may have a sealing layer for preventing the infiltration of water and oxygen into the devices like conventional organic EL devices.

Specific examples of the material for the sealing layer include a copolymer obtained by copolymerizing a monomer mixture containing tetrafluoroethylene and at least one comonomer, a fluorine-containing copolymer having a copolymer main chain containing a cyclized structure, polyethylene, polypropylene, polymethyl methacrylate, polyimide, polyurea, polytetrafluoroethylene, polychlorotrifluoroethylene, polydichlorodifluoroethylene, a copolymer of chlorotrifluoroethylene and dichlorodifluoroethylene, a water-absorptive substance having a water absorptivity of at least 1%, a vapor-barrier substance having a water absorptivity of 0.1% or less, metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, metal fluorides such as $MgF_2$, LiF, $AlF_3$ and $CaF_2$, liquid fluorinated carbons such as a perfluoroalkane, a perfluoroamine and a perfluoropolyether, a dispersion of an adsorbent to adsorb water and oxygen in the above liquid fluorinated carbon.

The formation of the sealing layer can use a vacuum deposition method, a spin coating method, a sputtering method, a casting method, an MBE (molecular-beam epitaxy) method, a cluster ion beam deposition method, an ion plating method, a plasma polymerization method (radio-frequency excited ion plating method), a reaction sputtering method, a plasma CVD method, a laser CVD method, a thermal CVD method or a gas source CVD method as required. When a liquid fluorinated carbon or a dispersion of adsorbent to adsorb water and oxygen in the liquid fluorinated carbon is used as a material for the sealing layer, preferably, the sealing layer is formed by providing a housing material outside an organic EL device (which may have another sealing layer already) formed on a substrate such that the housing material covers the organic EL device together with the above substrate while forming a space between the organic EL device and the housing material, and charging the space formed by the above substrate and the housing material with the above liquid fluorinated carbon or the above dispersion of an adsorbent to adsorb water and oxygen in the above liquid fluorinated carbon. The above housing material is preferably selected from glass or a polymer (e.g., polychlorotrifluoroethylene) having a small water absorptivity. When the housing material is used, the housing material alone may be provided without providing the above sealing layer. Otherwise, after the housing material is provided, a layer formed of an adsorbent to adsorb water and oxygen may be provided, or particles of the above adsorbent may be dispersed, in the space formed by the housing material and the above substrate.

The organic EL display panel of the present invention will be explained hereinafter.

The organic EL display panel of the present invention comprises a plurality of pixels each of which is formed of the above organic EL device I or organic EL device II of the present invention, the pixels being two-dimensionally arranged on one plane. The specification of the above two-dimensional arrangement is not specially limited, and it can be properly selected as required depending upon the specification of an intended organic EL display panel (X-Y matrix type or active matrix type, etc.

In the organic EL display panel of X-Y matrix type, for example, a desired number of transparent electrode (anode) lines are formed on a substrate in parallel with on another in the form of stripes, the organic single-layer portion or the organic multi-layer portion is formed so as to cover the transparent electrode lines, and a desired number of cathode (opposing electrode) lines are formed on the above organic single-layer or multi-layer portion in the direction at right angles with the transparent electrode lines in the form of stripes. As a result, pixels, i.e., organic EL devices are formed in intersection portions of the transparent electrode lines and the cathode (opposing electrode) lines viewed as a plan view. In this case, sides of the above transparent electrode lines which at least form the pixels (organic EL devices) have tapered surfaces or have flattening layers which are provided so as to abut on the side surfaces.

Further, in the organic EL device of active matrix type, for example, transparent electrodes having a rectangular or square form as a form viewed as a plan view are arranged at predetermined intervals, the organic single-layer portion or the multi-layer portion is formed on each of the above transparent electrodes, and a cathode (opposing electrode) is formed on the organic single-layer or multi-layer portions so as to form a flat film as an electrode common to all of organic EL devices. As a result, pixels, i.e., organic EL devices are formed in intersection portions of the transparent electrodes and the cathode (opposing electrode) viewed as a plan view. In this case, the sides of the above transparent electrodes have tapered surfaces or have flattening layers which are provided so as to abut on the side surfaces.

Each of the organic EL devices constituting the organic EL display panel may be organic EL devices I of the present invention, and they may be the organic EL devices II of the present invention. One organic EL display panel may have organic EL devices I and organic EL device II of the present invention together, while it is preferred to use organic EL devices I of the present invention alone or to use organic EL devices II of the present invention alone.

Colors of emitted light may be the same or different among the organic EL devices. The colors of emitted light of the organic EL devices differ depending upon organic light-emitting materials, and the organic light-emitting materials for the organic EL devices are therefore selected depending upon use of the organic EL display panel as an end product. Further, the color of emitted light and arrangements of the organic EL devices can be also properly selected depending upon use of the organic EL display panel as an end product.

The organic EL display panel of the present invention has a plurality of pixels of the above organic EL devices I or the organic EL devices II of the present invention two-dimensionally arranged on one plane, so that it can be easily obtained as one having high display qualities while preventing a decrease in display performances caused by a voltage drop, an increase in consumption power and an increase in RC time constant.

Examples of the present invention will be explained hereinafter, while the present invention shall not be limited to the following Examples.

EXAMPLE 1

(1) Preparation of transparent electrode

An In—Zn—O-containing amorphous oxide layer (indium atomic ratio, In/(In+Zn),=0.8) having a thickness of 300 nm was formed on one surface of a glass substrate having a size of 75×75×1.1 mm by a DC magnetron sputtering method using, as a sputtering target, an In—Zn—O-containing oxide sintered body having an indium (In) atomic ratio, In/(In+Zn), of 0.83. The above sputtering was carried out in a sputtering atmosphere containing mixed gases of argon gas and oxygen gas ($Ar:O_2$=1,000:2.8 (volume ratio))

at a vacuum degree of 0.2 Pa at a DC sputtering output of 2 W/cm². The above amorphous oxide layer was measured for a surface resistance to show 10 Ω/□.

Then, the above amorphous oxide layer was processed into two split rows in the form of stripes having a width of 110 μm, a length of 37.5 mm and a pitch of 120 μm by wet-etching using a 12% HBr aqueous solution as an etchant, to obtain a predetermined number of transparent electrode lines (included in transparent electrode I). The number of the transparent electrode lines in one row was 360, and between the rows, the transparent electrode lines were arranged in series by bringing their longitudinal directions into conformity.

The side surfaces (side surfaces extending in the longitudinal direction) of each of the above transparent electrode lines was tapered, and the angle formed by the above side surface and the glass substrate surface was observed through an electron microscope to find 30°. Further, the transparent electrode lines were measured for a surface flatness with a scanning atomic force microscope (AFM) to show 10 nm and thus had a very flat and smooth surface. Further, each transparent electrode line had an electric resistance of approximately 3.6 KΩ.

(2) Preparation of organic EL display panel I

The glass substrate on which the transparent electrode lines were formed in the above (1) (to be referred to as "transparent-electrode-line-possessing glass substrate" hereinafter) was ultrasonically cleaned in isopropyl alcohol for 5 minutes, and then subjected to UV/ozone cleaning for 30 minutes.

The cleaned transparent-electrode-line-possessing glass substrate was set in a substrate holder of a vacuum deposition apparatus. Then, first, a 4,4'-bis[N,N-di(3-methylphenyl)amino]-4"-phenyl-triphenylamine layer (to be abbreviated as "TPD74 layer" hereinafter) having a thickness of 80 nm was formed on the substrate surface on the side having the formed transparent electrode lines such that the TPD74 layer covered the transparent electrode lines. The TPD74 layer was to function as a first hole-injecting layer. Then, after the formation of the TPD74 layer, a 4,4'-bis[N-(1-naphthyl)-N-phenylamino]biphenyl layer (to be abbreviated as "NPD layer" hereinafter) having a thickness of 20 nm was formed on the above TPD74 layer. The NPD layer was to function as a second hole-injecting layer (hole-transporting layer). Further, following the formation of the NPD layer, a 4,4"-bis(2,2-diphenylvinyl)biphenyl layer (to be abbreviated as "DPVBi layer" hereinafter) having a thickness of 40 nm was formed on the NPD layer. The DPVBi layer was to function as a blue-light-emitting layer. Then, following the formation of the DPVBi layer, a tris(8-quinolinol)aluminum layer (to be abbreviated as "Alq layer" hereinafter) having a thickness of 20 nm was formed on the DPVBi layer. The Alq layer was to function as an electron-injecting layer.

Then, a mask having a predetermined number of opening lines having an opening width of 200 μm at a pitch of 300 μm was set below (deposition source side) the transparent-electrode-possessing substrate having up to the above Alq layer formed, and magnesium (Mg) and silver (Ag) were two-element-deposited to form a predetermined number of Mg:Ag alloy layers having the form of stripes and having a thickness of 200 nm on the above Alq layer such that the Mg:Ag alloy layers intersected with the above transparent electrode lines when viewed as a plan view. In this case, the deposition rate of Mg was set at 2 nm/second, and the deposition rate of Ag was set at 0.1 nm/second. The Mg:Ag alloy layers were to function as cathode (opposing electrode) lines.

The formation of up to the above cathode (opposing electrode) lines gave an organic EL display panel. This organic EL display panel is included in the organic EL display panel I of the present invention, in which pixels formed of organic EL devices I are two-dimensionally arranged in an X-Y matrix form. The above organic EL devices I are formed in intersection portions of the transparent electrode lines and the cathode (opposing electrode) lines viewed as a plan view, and the layer constitution thereof in the order from the glass substrate side is in the order of transparent electrode (anode; In—Zn—O-containing amorphous oxide layer), first hole-injecting layer (TPD74 layer), second hole-injecting layer (hole-transporting layer; NPD layer), light-emitting layer (DPVBi layer), electron-injecting layer (Alq layer) and cathode (opposing electrode; Mg:Ag alloy layer). In the above organic EL devices, the first hole-injecting layer (TPD74 layer), the second hole-injecting layer (hole-transporting layer; NPD layer), the light-emitting layer (DPVBi layer) and the electron-injecting layer (Alq layer) correspond to the organic multi-layer portion.

(3) Driving test on organic EL display panel

A driving unit was connected to the organic EL display panel prepared in the above (2), the cathode lines were used as scanning electrodes, the transparent electrode lines were used as signal electrodes, and the organic EL display panel was top and bottom split-driven at a duty ratio of 1/120, to give a display having high qualities.

That is, no short circuit occurred among the pixels (organic EL devices), and there was observed no crosstalk caused by the short circuit. Further, since each transparent electrode line had a small electric resistance of as small as about 3.6 KΩ (had a surface resistance of as small as 10 Ω/□), a voltage drop was also small, and each pixel uniformly emitted light. Further, there was found neither a spot defect nor a line defect induced by the height-level-difference-induced breakage of the organic multi-layer portion or the cathode lines. When the pixels during the driving of the panel were observed through a stereoscopic microscope, dark spots were very rare. It is presumably because the transparent electrode lines had a surface flatness of as small as 10 nm and had a remarkably flat and smooth surface that the dark spots were very rare.

EXAMPLE 2

An In—Zn—O-containing amorphous oxide layer (atomic ratio of In, In/(In+Zn)=0.8) having a thickness of 300 nm was formed in the same manner as in Example 1(1).

Then, a photoresist film is formed on the above In—Zn—O-containing amorphous oxide layer, and exposure using a predetermined exposure master mask and development using a predetermined developer solution were carried out, to form a resist pattern having a desired form. Then, wet-etching was carried out with a 12% HBr aqueous solution as an etchant. Then, while the above resist pattern was maintained as it was, an aluminum (Al) layer having a thickness of 270 nm was formed on the resist pattern and the glass surface on the side where the resist pattern was formed, by an electron beam deposition method.

Then, the above resist pattern was removed with a predetermined release solution, to give a glass substrate on which two split rows of a predetermined number of In—Zn—O-containing amorphous oxide layer transparent electrode lines having a width of 110 μm, a length of 37.5 mm and a pitch of 120 μm were formed and the above Al layer was formed so as to abut on the side surface of each transparent electrode line (the above substrate will be referred to as "glass substrate A" hereinafter). The number of the transparent electrode lines of each row formed on the glass substrate A was 360, and between the rows, the transparent electrode lines were arranged in series by bringing their longitudinal directions into conformity.

Then, an aqueous solution having an ammonium tartarate concentration of 0.1 mol % and ethylene glycol were mixed in a volume ratio of 1:9, and the pH of the mixture was adjusted to 7.0 by adding an ammonium aqueous solution, to a neutral electrolytic solution for anodization. And, the above substrate A was immersed in the neutral electrolytic solution, and anodized under conditions of an applied voltage of 240 V, a current density of 1 mA/cm$^2$ and a solution temperature of 40° C. with using the above Al layer formed on the glass substrate A as an anode and a platinum electrode as a cathode, to completely oxidize the above Al layer. By the above anodization, an aluminum oxide layer having a thickness of 300 nm, derived from the above Al layer, was formed so as to abut on the side surface of each of the above transparent electrode lines. The aluminum oxide layer was to function as a flattening layer.

Each transparent electrode line formed on the glass substrate having up to the above flattening layer (aluminum oxide layer) formed (the glass substrate will be referred to as "glass substrate B" hereinafter) had an electric resistance of 3.8 KΩ.

(2) Preparation of organic EL display panel II

An organic EL display panel was obtained in the same manner as in Example 1(2) except that the glass substrate B obtained in the above (1) was used. The organic EL display panel is included in the organic EL display panel II of the present invention, in which pixels formed of organic EL devices II are two-dimensionally arranged in an X-Y matrix form.

(3) Driving test on organic EL display panel

A driving unit was connected to the organic EL display panel prepared in the above (2), and the organic EL display panel was driven in the same manner as in Example 1(3) to give a display having high qualities.

That is, no short circuit occurred among the pixels (organic EL devices), and there was observed no crosstalk caused by the short circuit. Further, since each transparent electrode line had a small electric resistance of as small as about 3.8 KΩ (had a surface resistance of as small as 10 Ω/□), a voltage drop was also small, and each pixel uniformly emitted light. Further, there was found neither a spot defect nor a line defect induced by the height-level-difference-induced breakage of the organic multi-layer portion or the cathode lines. When the pixels during the driving of the panel were observed through a stereoscopic microscope, dark spots were very rare. It is presumably because the transparent electrode lines had a surface flatness of as small as 17 nm and had a remarkably flat and smooth surface that the dark spots were very rare.

EXAMPLE 3

(1) Preparation of transparent electrode

First, a TiO$_2$ layer having a thickness of 100 nm was formed on one surface of a glass plate having a size of 75×75×1.1 mm by an RF magnetron sputtering method, to obtain a transparent substrate having an undercoat layer formed of the above TiO$_2$ layer. The formation of the TiO$_2$ layer was carried out under a sputtering atmosphere of argon gas at a sputtering vacuum degree of 0.2 Pa at an RF sputtering output of 2 W/cm$^2$.

Then, an Ag layer having a thickness of 5 nm was formed on the above TiO$_2$ layer by a DC magnetron sputtering method. In this case, the sputtering atmosphere and the vacuum degree were the same as those for the formation of the above TiO$_2$ layer, and the DC sputtering output was set at 1 W/cm$^2$.

Thereafter, an In—Zn—O-containing amorphous oxide layer (atomic ratio of In, In/(In+Zn)=0.8) having a thickness of 100 nm was formed on the above Ag layer by a DC magnetron sputtering method. In this case, the sputtering was carried out under a sputtering atmosphere of mixed gases of argon gas and oxygen gas (Ar:O$_2$=1,000:2.8 (volume ratio)) at a sputtering vacuum degree of 0.2 Pa at a DC sputtering output of 2 W/cm$^2$.

The transparent electrically conductive layer having a two-layer structure formed of the above Ag layer and the above In—Zn—O-containing amorphous oxide layer was measured for a surface resistance and a light transmittance to show that the surface resistance was 5 Ω/□ and that the light transmittance in a visible region of wavelength of 420 to 650 nm was 70% or more.

Then, the above transparent electrically conductive layer having the two-layer structure was patterned to the same pattern as that in Example 1(1) by wet-etching using a 15% HBr aqueous solution as an etchant, to give intended transparent electrode lines (included in transparent electrode I) (The glass substrate having up to the above transparent electrode lines formed will be referred to as "transparent-electrode-lines-possessing glass substrate" hereinafter).

In each of the above transparent electrode lines, side surfaces (side surfaces extending in the longitudinal direction) of the Ag layer and the In—Zn—O-containing amorphous oxide layer had a tapered form, and an angle formed by the side surface and the glass substrate surface was observed through an electron microscope to find 30°. Further, the transparent electrode lines were measured for a surface flatness with a scanning atomic force microscope (AFM) to show 10 nm and thus had a very flat and smooth surface. Further, each transparent electrode line had an electric resistance of approximately 2.0 KΩ.

(2) Preparation of organic EL display panel I

An organic EL display panel was prepared in the same manner as in Example 1(2) except that the transparent-electrode-lines-possessing glass substrate obtained in the above (1) was used.

The above organic EL display panel is included in the organic EL display panel I of the present invention.

(3) Driving test on organic EL display panel

A driving unit was connected to the organic EL display panel prepared in the above (2), and the organic EL display panel was driven in the same manner as in Example 1(3) to give a display having high qualities.

That is, no short circuit occurred among the pixels (organic EL devices), and there was observed no crosstalk caused by the short circuit. Further, since each transparent electrode line had a small electric resistance of as small as about 2.0 KΩ (had a surface resistance of as small as 5 Ω/□) so that a voltage drop was also small, and each pixel uniformly emitted light. Further, there was found neither a spot defect nor a line defect induced by the height-level-difference-induced breakge of the organic multi-layer portion or the cathode lines. When the pixels during the driving of the panel were observed through a stereoscopic microscope, dark spots were very rare. It is presumably because the transparent electrode lines had a surface flatness of as small as 10 nm and had a remarkably flat and smooth surface that the dark spots were very rare.

EXAMPLE 4

(1) Preparation of transparent electrode

First, an ITO layer having a thickness of 100 nm was formed on one surface of a glass substrate having a size of 75×75×1.1 mm by a DC magnetron sputtering method. The above sputtering was carried out under a sputtering atmosphere of mixed gases of argon gas and oxygen gas ($Ar:O_2$= 1,000:2.8 (volume ratio) at a sputtering vacuum degree of 0.2 Pa at an RF sputtering output of 2 $W/cm^2$.

Then, an Ag layer having a thickness of 10 nm was formed on the above ITO layer by a DC magnetron sputtering method. In this case, the sputtering atmosphere and the vacuum degree were the same as those for the formation of the above ITO layer, and the DC sputtering output was set at 1 $W/cm^2$.

Thereafter, an In—Zn—O-containing amorphous oxide layer (atomic ratio of In, In/(In+Zn)=0.8) having a thickness of 100 nm was formed on the above Ag layer by a DC magnetron sputtering method. In this case, the sputtering atmosphere, the vacuum degree and the DC sputtering output were the same as those for the formation of the above ITO layer.

The transparent electrically conductive layer having a three-layer structure formed of the above ITO layer, the above Ag layer and the above In—Zn—O-containing amorphous oxide layer was measured for a surface resistance and a light transmittance to show that the surface resistance was 3 $\Omega/\square$ and that the light transmittance in a visible region of wavelength of 420 to 650 nm was 70% or more.

Then, the above transparent electrically conductive layer having the three-layer structure was patterned to the same pattern as that in Example 1(1) by wet-etching using a 15% HBr aqueous solution as an etchant, to give intended transparent electrode lines (included in transparent electrode I) (The glass substrate having up to the above transparent electrode lines formed will be referred to as "transparent-electrode-lines-possessing glass substrate" hereinafter).

In each of the above transparent electrode lines, side surfaces (side surfaces extending in the longitudinal direction) of the Ag layer and the In—Zn—O-containing amorphous oxide layer had a clear tapered form, and an angle formed by the side surface and the glass substrate surface was observed through an electron microscope to find 30°. Further, the side surfaces (side surfaces extending in the longitudinal direction) of the ITO layer also had a tapered form.

The above transparent electrode lines were measured for a surface flatness with a scanning atomic force microscope (AFM) to show 10 nm and thus had a very flat and smooth surface. Further, each transparent electrode line had an electric resistance of approximately 1.2 K$\Omega$.

(2) Preparation of organic EL display panel I

An organic EL display panel was prepared in the same manner as in Example 1(2) except that the transparent-electrode-lines-possessing glass substrate obtained in the above (1) was used.

The above organic EL display panel is included in the organic EL display panel I of the present invention.

(3) Driving test on organic EL display panel

A driving unit was connected to the organic EL display panel prepared in the above (2), and the organic EL display panel was driven in the same manner as in Example 1(3) to give a display having high qualities.

That is, no short circuit occurred among the pixels (organic EL devices), and there was observed no crosstalk caused by the short circuit. Further, since each transparent electrode line had a small electric resistance of as small as about 1.2 K$\Omega$ (had a surface resistance of as small as 3 $\Omega/\square$) so that a voltage drop was also small, and each pixel uniformly emitted light. Further, there was found neither a spot defect nor a line defect induced by the height-level-difference-induced breakge of the organic multi-layer portion or the cathode lines. When the pixels during the driving of the panel were observed through a stereoscopic microscope, dark spots were very rare. It is presumably because the transparent electrode lines had a surface flatness of as small as 10 nm and had a remarkably flat and smooth surface that the dark spots were very rare.

EXAMPLE 5

(1) Preparation of transparent electrode

A tansparent electrically conductive layer having a three-layer structure was formed in the same manner as in Example 4(1) except that an In—Zn—O-containing amorphous oxide layer (atomic ratio of In, In/(In+Zn)=0.8) having a thickness of 100 nm was formed in place of the ITO layer and the thickness of the Ag layer was changed to 10 nm. In the formation of the In—Zn—O-containing amorphous oxide layer in place of the ITO layer, the sputtering atmosphere, the vacuum degree and the DC sputtering output were set under the same conditions for the formation of the ITO layer in Example 4(1).

The above transparent electrically conductive layer (layer having a three-layer structure formed of In—Zn—O-containing amorphous oxide layer, Ag layer and In—Zn—O-containing amorphous oxide layer) was measured for a surface resistance and a light transmittance to show that the surface resistance was 5 $\Omega/\square$ and that the light transmittance in a visible region of wavelength of 420 to 650 nm was 65% or more.

Then, the above transparent electrically conductive layer having the three-layer structure was patterned to the same pattern as that in Example 1(1) by wet-etching using a 15% HBr aqueous solution as an etchant, to give intended transparent electrode lines (included in transparent electrode I) (The glass substrate having up to the above transparent electrode lines formed will be referred to as "transparent-electrode-lines-possessing glass substrate" hereinafter).

In each of the above transparent electrode lines, side surfaces (side surfaces extending in the longitudinal direction) of the Ag layer and the In—Zn—O-containing amorphous oxide layer had a clear tapered form, and an angle formed by the side surface and the glass substrate surface was observed through an electron microscope to find 30°.

The above transparent electrode lines were measured for a surface flatness with a scanning atomic force microscope (AFM) to show 10 nm and thus had a very flat and smooth surface. Further, each transparent electrode line had an electric resistance of approximately 2.0 K$\Omega$.

(2) Preparation of organic EL display panel I

An organic EL display panel was prepared in the same manner as in Example 1(2) except that the transparent-electrode-lines-possessing glass substrate obtained in the above (1) was used.

The above organic EL display panel is included in the organic EL display panel I of the present invention.

(3) Driving test on organic EL display panel

A driving unit was connected to the organic EL display panel prepared in the above (2), and the organic EL display panel was driven in the same manner as in Example 1(3) to give a display having high qualities.

That is, no short circuit occurred among the pixels (organic EL devices), and there was observed no crosstalk caused by the short circuit. Further, since each transparent electrode line had a small electric resistance of as small as about 2.0 K$\Omega$ (had a surface resistance of as small as 5 $\Omega/\square$) so that a voltage drop was also small, and each pixel uniformly emitted light. Further, there was found neither a spot defect nor a line defect induced by the height-level-difference-induced breakage of the organic multi-layer portion or the cathode lines. When the pixels during the driving of the panel were observed through a stereoscopic microscope, dark spots were very rare. It is presumably because the transparent electrode lines had a surface flatness of as small as 10 nm and had a remarkably flat and smooth surface that the dark spots were very rare.

COMPARATIVE EXAMPLE 1

In place of the In—Zn—O-containing amorphous oxide layer in Example 1(1), a crystalline ITO layer having a thickness of 200 nm was formed by an electron-beam deposition method in which the substrate temperature was set at 200° C. The above crystalline ITO layer has a poor surface flatness, as poor as 60 nm, and not only it was crystalline, but also the surface flatness thereof was outside the range specified in the present invention. The above crystalline ITO layer had a surface resistance of as large as 15 $\Omega/\square$, which was also outside the range specified in the present invention. The above crystalline ITO layer had a grain size of 100 to 200 nm.

Then, the above crystalline ITO layer was wet-etched in the same manner as in Example 1(1), to form transparent electrode lines. The angle formed by the side surface of the transparent electrode line and the glass substrate surface was 80°.

Then, an organic EL display panel was prepared in the same manner as in Example 1(2), and when a driving test thereof was conducted in the same manner as in Example 1(3), no excellent display qualities were obtained.

That is, a short circuit occurred among organic EL devices, and crosstalks therefore also occurred. Each pixel (organic EL device) relatively uniformly emitted light, while there were found a number of spot defects and line defects caused by the height-level-difference-induced breakage of the organic multi-layer portion or the cathode lines. When the pixels during the driving of the panel were observed through a stereoscopic microscope, a number of dark spots were found.

COMPARATIVE EXAMPLE 2

First, in place of the In—Zn—O-containing amorphous oxide layer in Example 1(1), a crystalline ITO layer having a thickness of 100 nm was formed by a DC magnetron sputtering method. In this case, a sintered body of a mixture of indium oxide with tin oxide (the atomic ratio of In to Sn was 9:1) was used as a sputtering target, the sputtering atmosphere was the same as that in Example 1(1), and the substrate temperature was set at 200° C.

The above crystalline ITO layer had a surface flatness of 20 nm, which is within the range specified in the present invention. However, it had a surface resistance of as large as 30 $\Omega/\square$, and not only it was a crystalline layer but also the surface resistance thereof was outside the range specified in the present invention.

Then, the above crystalline ITO layer was wetetched in the same manner as in Example 1(1), to form transparent electrode lines. The angle formed by the side surface of transparent electrode line and the glass substrate surface was 80°. Further, each transparent electrode line had an electric resistance of 10 K$\Omega$ or higher.

Then, an organic EL display panel was prepared in the same manner as in Example 1(2), and when a driving test thereof was conducted in the same manner as in Example 1(3), no excellent display qualities were obtained.

That is, since the transparent electrode lines had an electric resistance of as high as 10 K$\Omega$ or more, a large voltage drop occurred, and each pixel (organic EL device) did not uniformly emitted light.

As explained above with reference to Examples, according to the organic EL device I, the organic EL device II, the organic EL display panel I or the organic EL display panel II of the present invention, there can be easily provided an organic EL display panel in which a decrease in display performances caused by a voltage drop, an increase in consumption power and an increase in RC time constant are prevented.

What is claimed is:

1. An organic EL device in which a transparent electrode is formed on a substrate, an organic single-layer portion or organic multi-layer portion containing at least an organic light-emitting material is formed on the transparent electrode and an opposing electrode is formed on the organic single layer portion or the organic multi-layer portion;

characterized in that,
the said transparent electrode has an amorphous electrically conductive oxide layer, has a surface resistance of 12 $\Omega/\square$ or less and a surface flatness of 20 nm or less and has a side surface having a tapered form,
the said organic single-layer portion or organic multi-layer portion is formed on the said amorphous electrically conductive oxide layer.

2. The organic EL device of claim 1, wherein the transparent electrode is formed of a single-layer amorphous electrically conductive oxide layer.

3. The organic EL device of claim 2, wherein the amorphous electrically conductive oxide layer is formed of an amorphous oxide containing indium (In), zinc (Zn) and oxygen (O) as constituent elements, the amorphous oxide having an indium atomic ratio, In/(In+Zn), of 0.5 to 0.9.

4. An organic EL display panel, wherein a plurality of pixels formed of organic EL devices recited in claim 2 are two-dimensionally arranged on one surface of a substrate.

5. The organic EL device of claim 1, wherein the transparent electrode has a two-layer structure formed of one amorphous electrically conductive oxide layer and one thin metal layer, the organic single-layer portion or the organic multi-layer portion being formed on the said amorphous electrically conductive oxide layer.

6. The organic EL device of claim 5, wherein the amorphous electrically conductive oxide layer is formed of an amorphous oxide containing indium (In), zinc (Zn) and oxygen (O) as constituent elements, the amorphous oxide having an indium atomic ratio, In/(In+Zn), of 0.5 to 0.9.

7. An organic EL display panel, wherein a plurality of pixels formed of organic EL devices recited in claim 5 are two-dimensionally arranged on one surface of a substrate.

8. The organic EL device of claim 1, wherein the transparent electrode has a three-layer structure formed of two transparent electrically conductive layers and one thin metal layer sandwiched between the two transparent electrically conductive layers, at least one of the said two transparent electrically conductive layers being the amorphous electrically conductive oxide layer, the organic single-layer portion or the organic multi-layer portion being formed on the said amorphous electrically conductive oxide layer.

9. The organic EL device of claim 8, wherein the amorphous electrically conductive oxide layer is formed of an amorphous oxide containing indium (In), zinc (Zn) and oxygen (O) as constituent elements, the amorphous oxide having an indium atomic ratio, In/(In+Zn), of 0.5 to 0.9.

10. An organic EL display panel, wherein a plurality of pixels formed of organic EL devices recited in claim 8 are two-dimensionally arranged on one surface of a substrate.

11. The organic EL device of claim 1, wherein the side surface of the transparent electrode and the substrate surface form an angle of 60° or less and greater than 0°.

12. An organic EL display panel, wherein a plurality of pixels formed of organic EL devices recited in claim 1 are two-dimensionally arranged on one surface of a substrate.

13. The organic EL device of claim 1 wherein the surface resistance of the transparent electrode is 10 $\Omega/\square$ or less.

14. The organic EL device of claim 1, wherein the surface resistance of the transparent electrode is 5 $\Omega/\square$ or less.

15. An organic EL device in which a transparent electrode is formed on a substrate, an organic single-layer portion or organic multi-layer portion containing at least an organic light-emitting material is formed on the transparent electrode and an opposing electrode is formed on the organic single layer portion or the organic multi-layer portion;

characterized in that,
the said transparent electrode has an amorphous electrically conductive oxide layer and has a surface resistance of 12 $\Omega/\square$ or less and a surface flatness of 20 nm or less, the said organic single-layer portion or organic multi-layer portion is formed on the said amorphous electrically conductive oxide layer, a flattening-layer is provided so as to abut on the side surface of the transparent electrode for moderating a height-level difference between the transparent electrode and the surface of the substrate.

16. The organic EL device of claim 15, wherein the transparent electrode is formed of a single-layer amorphous electrically conductive oxide layer.

17. The organic EL device of claim 16, wherein the amorphous electrically conductive oxide layer is formed of an amorphous oxide containing indium (In), zinc (Zn) and oxygen (O) as constituent elements, the amorphous oxide having an indium atomic ratio, In/(In+Zn), of 0.5 to 0.9.

18. The organic EL device of claim 15, wherein the transparent electrode has a two-layer structure formed of one amorphous electrically conductive oxide layer and one thin metal layer and the flattening layer has a side surface having a tapered form, the organic single-layer portion or the organic multi-layer portion being formed on the said amorphous electrically conductive oxide layer.

19. The organic EL device of claim 18, wherein the amorphous electrically conductive oxide layer is formed of an amorphous oxide containing indium (In), zinc (Zn) and oxygen (O) as constituent elements, the amorphous oxide having an indium atomic ratio, In/(In+Zn), of 0.5 to 0.9.

20. The organic EL device of claim 15, wherein the transparent electrode has a three-layer structure formed of two transparent electrically conductive layers and one thin metal layer sandwiched between the two transparent electrically conductive layers, at least one of the said two transparent electrically conductive layers being the amorphous electrically conductive oxide layer, the transparent electrode having a side surface having a tapered form, the single-layer portion or the organic multi-layer portion being formed on the said amorphous electrically conductive oxide layer.

21. The organic EL device of claim 20, wherein the amorphous electrically conductive oxide layer is formed of an amorphous oxide containing indium (In), zinc (Zn) and oxygen (O) as constituent elements, the amorphous oxide having an indium atomic ratio, In/(In+Zn), of 0.5 to 0.9.

22. An organic EL display panel, wherein a plurality of pixels formed of organic EL devices recited in claim 15 are two-dimensionally arranged on one surface of a substrate.

23. The organic EL device of claim 15, wherein the surface resistance of the transparent electrode is 10 $\Omega/\square$ or less.

24. The organic EL device of claim 15, wherein the transparent electrode has a two-layered structure of one amorphous electrically conductive oxide layer and one thin metal layer, the organic single-layer portion or the organic multi-layer portion being formed on the said amorphous electrically conductive oxide layer.

25. The organic EL device of claim 15, wherein the transparent electrode has a three-layered structure formed of two transparent electrically conductive layers and one thin metal layer sandwiched between the two transparent electrically conductive layers, at least one of the said two transparent electrically conductive layers being the amorphous electrically conductive oxide layer, the single-layered portion or the organic multi-layer portion being formed on the said amorphous electrically conductive oxide layer.

26. The organic EL device of claim 15, wherein the surface resistance of the transparent electrode is 5 $\Omega/\square$ or less.

* * * * *